United States Patent [19]
Kim

[11] Patent Number: 6,144,597
[45] Date of Patent: Nov. 7, 2000

[54] MEMORY DEVICE HAVING A SELF-TEST FUNCTION USING SENSE AMPLIFIERS AND A METHOD FOR CONTROLLING A DATA WRITING OPERATION IN A TEST MODE OF THE MEMORY DEVICE

[75] Inventor: Moo Suk Kim, Ichon-shi, Rep. of Korea

[73] Assignee: Hyundai Electronics Industries Co., Ltd., Ichon-shi, Rep. of Korea

[21] Appl. No.: 09/321,887

[22] Filed: May 28, 1999

[30] Foreign Application Priority Data

May 29, 1998 [KR] Rep. of Korea ............ 98-19780

[51] Int. Cl.[7] .................................................. G11C 7/00
[52] U.S. Cl. .................... 365/201; 365/203; 365/230.03; 714/718; 714/719
[58] Field of Search ............................. 365/201, 203, 365/230.03; 714/718, 719

[56] References Cited

U.S. PATENT DOCUMENTS

| | | | |
|---|---|---|---|
| 5,197,031 | 3/1993 | Choi | 365/201 |
| 5,305,261 | 4/1994 | Furutani et al. | 365/189.01 |
| 5,351,213 | 9/1994 | Nakashima | 365/201 |
| 5,367,492 | 11/1994 | Kawamoto et al. | 365/201 |
| 5,508,960 | 4/1996 | Pinkham | 365/189.01 |
| 5,528,551 | 6/1996 | Pinkham | 365/230.06 |
| 5,553,029 | 9/1996 | Reohr et al. | 365/208 |
| 5,684,748 | 11/1997 | Jang | 365/201 |
| 5,703,816 | 12/1997 | Nam et al. | 365/200 |

*Primary Examiner*—David Nelms
*Assistant Examiner*—Connie C. Yoha
*Attorney, Agent, or Firm*—Jacobson, Price, Holman & Stern, PLLC

[57] ABSTRACT

A memory device configured to simultaneously write data on all cells on one row of a matrix cell array constituting the memory device in a test mode, based on data latched in sense amplifiers included in the memory device. The memory device includes a pre-charge control unit coupled to a bit line precharge block and a sense amplifier pre-charge block and adapted to control respective pre-charge operations of the bit line precharge block and sense amplifier pre-charge block in a test mode in such a fashion that the pre-charge operations are deactivated in the test mode after an initial data writing operation is completed for one cell, thereby causing data used in the initial data writing operation to be still latched in the sense amplifiers, so that a subsequent data writing operation is repeatedly carried out, word line by word line, using the latched data. In every data writing operation, all cells on one row of the cell array are simultaneously written with data. Accordingly, it is possible to reduce the test data writing time.

3 Claims, 2 Drawing Sheets

MEMORY DEVICE HAVING A SELF-TEST FUNCTION USING SENSE AMPLIFIERS AND A METHOD FOR CONTROLLING A DATA WRITING OPERATION IN A TEST MODE OF THE MEMORY DEVICE

BACKGROUND OF THE INVENTION

1. Field of the Invention

The present invention relates to a memory device having a self-test function using sense amplifiers, and more particularly to a memory device configured to simultaneously write data on all cells on one row of a matrix cell array constituting the memory device in a test mode, based on data latched in sense amplifiers included in the memory device, thereby reducing the test data write time. The present invention also relates to a method for controlling a data writing operation in a test mode of the above memory device.

2. Description of the Related Art

In accordance with conventional data writing techniques, data input to a memory device is written on only one cell of one bit designated by a selected row address and a selected column address.

A conventional data writing operation will now be described in conjunction with FIG. 1. Referring to FIG. 1, a RAM is illustrated which includes a sense amplification circuit configured to have common sense amplifiers.

As shown in FIG. 1, the RAM includes a first cell array block 1, a first selection unit 2 for selecting the first cell array block 1 in response to a first bit line isolation signal BISH, and a bit line pre-charge block 3 for pre-charging two bit lines constituting each bit line pair. The RAM also includes a second cell array block 4, a second selection unit 5 for selecting the second cell array block 4 in response to a second bit line isolation signal BISL, a sense amplifier block 6 for amplifying data output from the cell array blocks 1 and 4, and a sense amplifier pre-charge block 7 for pre-charging the sense amplifier block 6.

When the RAM having the above-mentioned configuration is to be written with data, one cell array block is first selected from the cell array blocks 1 and 4 included in the RAM in accordance with operations of the first and second selection units 2 and 5.

Thereafter, a cell to be written with one bit is selected from the selected cell array block, based on a row address strobe signal, a column address strobe signal, a row address signal and a column address signal. The data is then written in the selected cell via two bit lines associated therewith. After completing the data writing operation, the pre-charge block 3 is activated in response to a pre-charge signal BLP applied thereto. Simultaneously, a bit line pre-charge voltage signal vblp is applied to the pre-charge block 3. As a result, the bit lines are pre-charged with Vcc/2, namely, half the supply voltage.

At this time, the sense amplifier pre-charge block 7 is also activated, thereby pre-charging the sense amplifiers.

Consequently, the data written in the writing operation is erased, so that it cannot be used in the next writing operation. This means that it is necessary to input data in every writing operation.

Thus, the RAM operates in a limited fashion. In other words, upon testing a product such as the above-mentioned memory device, the number of data being read corresponds to the number of data being written. In order to achieve data writing for the entire cell of the cell array, it is necessary to sequentially carry out a data writing operation for one column of the cell array corresponding to a column address while addressing cells on the column by row addresses Xmin to Xmax, respectively, and then sequentially carry out the same data writing operation, as mentioned above, for the next column of the cell array corresponding to a column address incremented by one from the previous column address while addressing cells on the next column by row addresses Xmin to Xmax, respectively.

This operation is repeated for all columns of the cell array. In regard to data writing, there is no other method being more effective, except for a method using a page mode, which method may provide a more rapid writing operation.

SUMMARY OF THE INVENTION

Therefore, the present invention has been made in view of the above-mentioned problems, and an object of the invention is to provide a memory device having a self-test function, which memory device is configured such that, using data written in a cell array block in one writing operation in a test mode and yet latched in sense amplifiers, subsequent data writing operations are carried out by word lines, so that it can eliminate a requirement to input separate data in the subsequent data writing operations, thereby reducing the test data writing time.

Another object of the invention is to provide a method for controlling a data writing operation in a test mode of the above memory device.

In accordance with one aspect, the present invention provides a memory device comprising a plurality of cell array blocks arranged in rows, each of the cell array blocks having cells arranged in columns and coupled to word lines, respectively, a sense amplifier block adapted to amplify data input to or output from each of the cell array blocks and provided with sense amplifiers coupled to the cells of each of the cell array blocks via bit lines, respectively, a bit line pre-charge block for pre-charging the bit lines in response to a bit line pre-charge signal, and a sense amplifier pre-charge block for pre-charging the sense amplifiers, further comprising: a pre-charge control unit coupled to the bit line pre-charge block and the sense amplifier pre-charge block and adapted to control respective pre-charge operations of the bit line pre-charge block and the sense amplifier pre-charge block in a test mode in such a fashion that the pre-charge operations are deactivated in the test mode after an initial data writing operation is completed for one cell, thereby causing data used in the initial data writing operation to be still latched in the sense amplifiers, so that a subsequent data writing operation is repeatedly carried out, word line by word line, using the latched data.

In accordance with another aspect, the present invention provides a method for controlling a data writing operation in a test mode of a memory device having a matrix cell array including a plurality of cell array blocks arranged in rows, each of the cell array blocks having cells arranged in columns and coupled to word lines and sense amplifiers, respectively, comprising the steps of: (a) executing a data writing operation for a cell selected from a selected cell array block based on a row address and a column address; (b) deactivating a pre-charge operation for the sense amplifiers in response to a signal indicative of a test mode, thereby allowing the sense amplifiers to be still latched with data used in the step (a); (c) incrementing the row address by one; (d) simultaneously writing the latched data in all cells coupled to a word line corresponding to the incremented row address; and (e) repeating the steps (c) and (d) for the remaining word lines of the cell array.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
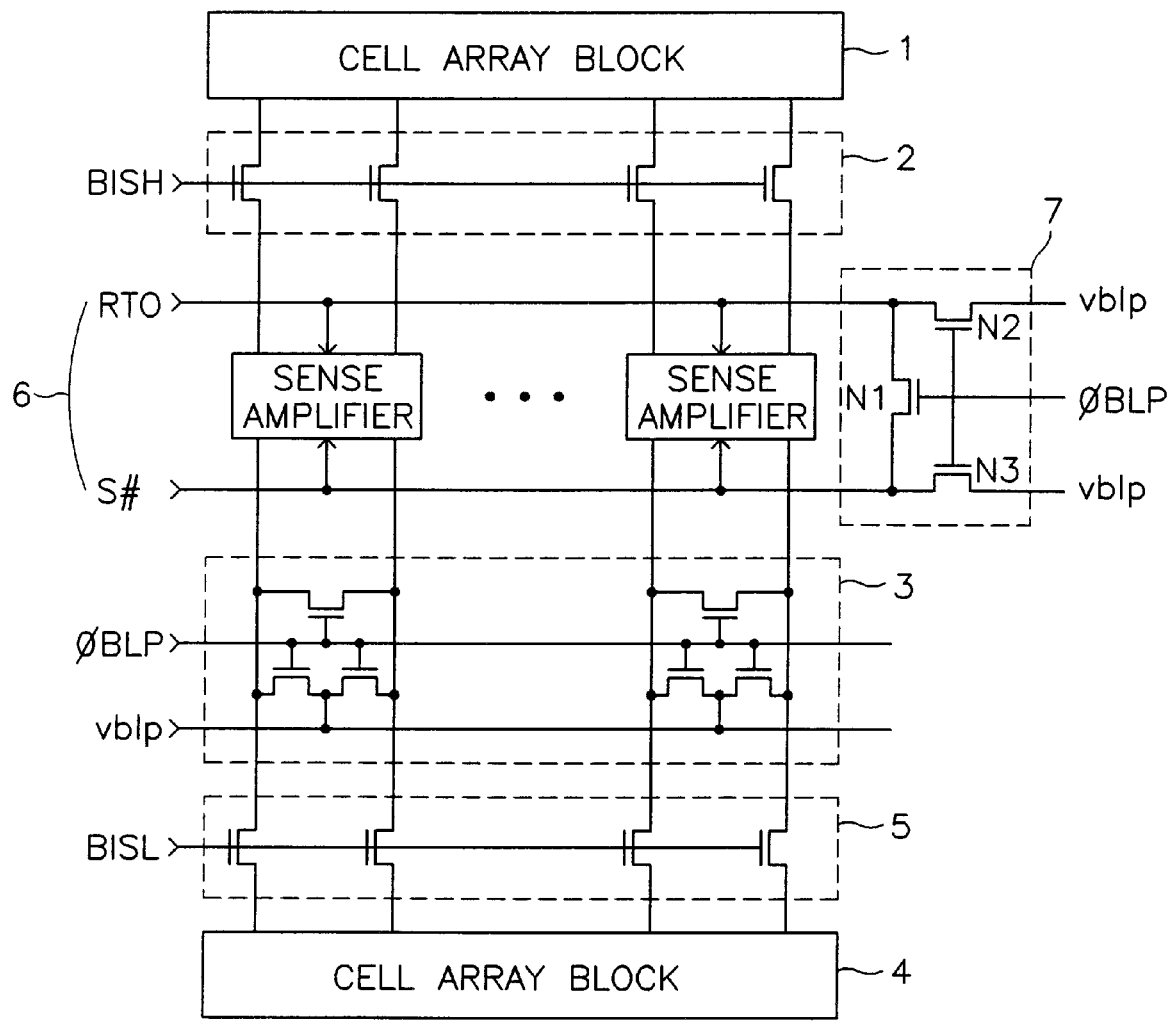
FIG. 1 is a circuit diagram illustrating a semiconductor device having a conventional testing configuration.
Figure 2:
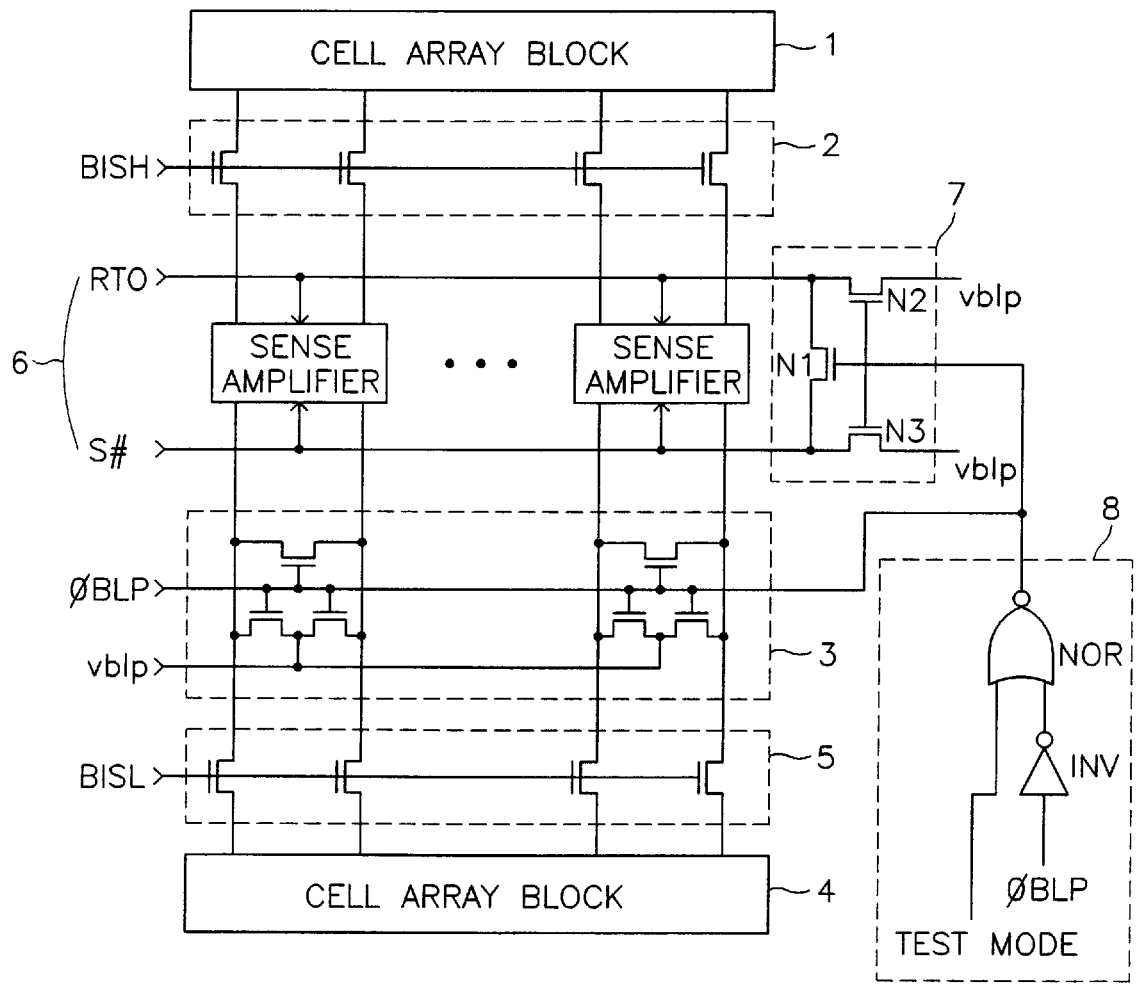
FIG. 2 is a circuit diagram illustrating a semiconductor device having a testing configuration according to the present invention.

Referring to FIG. 2, a semiconductor device, to which the present invention is applied, is illustrated. This semiconductor device is a RAM including a sense amplification circuit configured to have common sense amplifiers. The basic configuration of this RAM is similar to that of the present invention. In FIG. 2, accordingly, elements respectively corresponding to those in FIG. 1 are denoted by the same reference numerals.

As shown in FIG. 2, the RAM of the present invention includes a first cell array block 1, a first selection unit 2 for selecting the first cell array block 1 in response to a first bit line isolation signal BISH, and a bit line pre-charge block 3 for pre-charging two bit lines constituting each bit line pair. The RAM also includes a second cell array block 4, a second selection unit 5 for selecting the second cell array block 4 in response to a second bit line isolation signal BISL, a sense amplifier block 6 for amplifying data output from the cell array blocks 1 and 4, and a sense amplifier pre-charge block 7 for pre-charging the sense amplifier block 6. The RAM also includes a pre-charge block control unit 8 for controlling the bit line pre-charge block 3 and sense amplifier pre-charge block 7 in such a fashion that in a test mode, no pre-charge operation is conducted even when a data writing operation has been conducted.

The pre-charge block control unit 8 includes a NOR gate NOR for receiving a signal indicative of an execution of the test mode and a bit line pre-charge signal BLP inverted by an inverter INV at two inputs thereof, respectively, and executing a NOR operation for those input signals.

An output from the NOR gate NOR is applied to respective gates of NMOS transistors N1 to N3 included in the sense amplifier pre-charge block 7. The first one of the NMOS transistors N1 to N3, namely, the NMOS transistor N1, is coupled in parallel to sense amplifiers included in the sense amplifier block 6. The remaining NMOS transistors N2 and N3 are coupled in series to the NMOS transistor N1. The NMOS transistors N2 and N3 are coupled in parallel to each other. The output from the NOR gate NOR is also coupled to an input of the bit line pre-charge block 3 to which the bit line pre-charge signal BLP is applied.

Now, the operation of the RAM having the above-mentioned configuration according to the present invention will be described.

When the RAM is to be written with data, one cell array block is first selected from the cell array blocks 1 and 4 included in the RAM in response to bit line isolation signals BISH and BISL respectively applied to the first and second selection units 2 and 5. Signals RTO and S#, which serve to apply a bias voltage to the sense amplifiers, are then enabled. Thereafter, a data writing operation is conducted for a cell selected from the selected cell array block in accordance with a row address signal and a column address signal. After completing this data writing operation, the test mode signal, which is applied to one input of the NOR gate NOR included in the pre-charge block control unit 8, is activated in order to indicate the fact that the current operation mode is the test mode. In the illustrated case, the test mode signal has a logic value of "1".

In response to the signal having a logic value of "1", the NOR gate NOR outputs a signal having a logic value of "0". This output signal from the NOR gate NOR is applied to respective gates of the NMOS transistors N1 to N3, thereby causing the NMOS transistors N1 to N3 to turn off. As a result, the pre-charge block 3 is maintained in an inactive state. Accordingly, no precharge operation for the sense amplifiers is conducted.

In this state, the data written in the above writing operation is still latched in the sense amplifiers of the sense amplifier block 6.

Thereafter, a subsequent data writing operation is conducted. For this subsequent data writing operation, a word line addressed by the next row address is activated. In this state, all cells, which are coupled to the activated word line and associated with respective columns of the cell array, are written with the data latched in the sense amplifiers of the sense amplifier block 6 in a simultaneous manner, respectively.

This data writing operation is repeatedly carried out until all cells in the selected cell array block, namely, one of the cell array blocks 1 or 4, are written with data. In accordance with such a data writing scheme, it is possible to considerably reduce the test data writing time.

This data writing scheme according to the present invention is similar to the conventional data writing scheme using a page mode in that cells coupled to one word line are simultaneously written with data in one data writing operation in a test mode. In the conventional scheme, however, it is necessary to input separate data for cells coupled to a subsequent word line in every subsequent data writing operation in the test mode. In accordance with the present invention, such a requirement is unnecessary.

In this regard, a considerable reduction in the test data writing time is achieved in accordance with the present invention.

Each row address required, after completing a data writing operation for one word line, to select a subsequent word line may be internally generated in the RAM or externally supplied from the outside. In the latter case, a separate address path other than the existing address paths may be used.

As apparent from the above description, in accordance with the present invention, when it is desired to write data in all blocks of a cell array, a data writing operation is first conducted in a general manner for a cell selected from a selected cell array block. After completing the data writing operation for the selected cell, the pre-charge operation for the sense amplifiers is controlled to allow the sense amplifiers to be still latched with data used in the data writing operation. Using the latched data, a subsequent data writing operation is repeatedly carried out for cells word line by word line until the data writing operation is completed for all rows of the cell array. In every data writing operation, all cells on one row of the cell array are simultaneously written with data. Accordingly, it is possible to reduce the test data writing time, thereby reducing the testing costs.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising a plurality of cell array blocks arranged in rows, each of the cell array blocks having cells arranged in columns and coupled to word lines respectively, a sense amplifier block adapted to amplify data input to or output from each of said cell array blocks and provided with sense amplifiers coupled to said cells of each of said cell array blocks via bit lines respectively, a bit line pre-charge block for pre-charging said bit lines in response to a bit line pre-charge signal, and a sense amplifier pre-charge block for pre-charging said sense amplifiers, further comprising:

a pre-charge-control unit coupled to said bit line pre-charge block and said sense amplifier pre-charge block in order to control the pre-charge operation of said sense amplifier, said pre-charge control unit including, an inverter for inverting said bit line pre-charge signal, and means for receiving a signal output from said inverter and a signal indicative of said test mode, Noring said received signals and for outputting the resultant signal to respective pre-charge signal inputs of said bit line and sense amplifier pre-charge blocks.

2. The memory device as set forth in claim 1, wherein said means for receiving a signal output from said inverter comprises a NOR gate.

3. A memory device comprising a plurality of cell array blocks arranged in rows, each of the cell array blocks having cells arranged in columns and coupled to word lines respectively, a sense amplifier block adapted to amplify data input to or output from each of said cell array blocks and provided with sense amplifiers coupled to said cells of each of said cell array blocks via bit lines respectively, a bit line pre-charge block for pre-charging said bit lines in response to a bit line pre-charge signal, and a sense amplifier pre-charge block for pre-charging said sense amplifiers, further comprising:

a pre-charge-control unit coupled to said bit line pre-charge block and said sense amplifier pre-charge block and adapted to control respective pre-charge operations of said bit line pre-charge block and said sense amplifier pre-charge block in a test mode so that said pre-charge operations are deactivated in said test mode after an initial data writing operation is completed for one cell, thereby causing data used in said initial data writing operation to be still latched in said sense amplifiers, so that a subsequent data writing operation is repeatedly carried out, word line by word line, using said latched data, said pre-charge control unit including, an inverter inverting said bit line pre-charge signal, and a NOR gate receiving a signal output from said inverter and a signal indicative of said test mode, Noring said received signals, and outputting the resultant signal to respective pre-charge signal inputs of said bit line pre-charge block and said sense amplifier pre-charge block.

* * * * *